US008228730B2

(12) United States Patent
Sandhu et al.

(10) Patent No.: US 8,228,730 B2
(45) Date of Patent: Jul. 24, 2012

(54) MEMORY CELL STRUCTURES AND METHODS

(75) Inventors: Gurtej S. Sandhu, Boise, ID (US); Bhaskar Srinivasan, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 12/872,368

(22) Filed: Aug. 31, 2010

(65) Prior Publication Data

US 2012/0051132 A1    Mar. 1, 2012

(51) Int. Cl.
G11C 16/04    (2006.01)
H01L 29/788    (2006.01)

(52) U.S. Cl. .............. 365/185.08; 365/185.01; 257/316

(58) Field of Classification Search .............. 365/185.08
See application file for complete search history.

(56) References Cited

U.S. PATENT DOCUMENTS

| | | | |
|---|---|---|---|
| 4,888,630 A | 12/1989 | Paterson | |
| 5,717,237 A * | 2/1998 | Chi | 257/315 |
| 5,748,525 A * | 5/1998 | Wong et al. | 365/185.05 |
| 5,801,993 A * | 9/1998 | Choi | 365/185.28 |
| 5,953,254 A | 9/1999 | Pourkeramati | |
| 6,034,892 A * | 3/2000 | Choi | 365/185.14 |
| 6,545,313 B1 * | 4/2003 | Jiang et al. | 257/321 |
| 6,580,642 B1 | 6/2003 | Wang | |
| 6,617,639 B1 | 9/2003 | Wang et al. | |
| 6,674,138 B1 * | 1/2004 | Halliyal et al. | 257/411 |
| 6,778,441 B2 * | 8/2004 | Forbes et al. | 365/185.26 |
| 6,903,969 B2 * | 6/2005 | Bhattacharyya | 365/185.08 |
| 7,105,852 B2 | 9/2006 | Moddel et al. | |
| 7,136,302 B2 * | 11/2006 | Forbes et al. | 365/185.01 |
| 7,473,956 B2 * | 1/2009 | Eldridge et al. | 257/314 |
| 7,474,558 B2 * | 1/2009 | Liao et al. | 365/175 |
| 7,485,513 B2 * | 2/2009 | Bhattacharyya | 438/167 |
| 7,550,800 B2 * | 6/2009 | Wang | 257/316 |
| 7,741,177 B2 * | 6/2010 | Wang | 438/257 |
| 7,751,254 B2 | 7/2010 | Park et al. | |
| 7,759,724 B2 * | 7/2010 | Forbes | 257/315 |
| 8,048,732 B2 * | 11/2011 | Kapoor et al. | 438/199 |
| 2001/0045595 A1 | 11/2001 | Black et al. | |
| 2003/0042534 A1 * | 3/2003 | Bhattacharyya | 257/317 |
| 2005/0001232 A1 | 1/2005 | Bhattacharyya | |
| 2009/0185426 A1 * | 7/2009 | Wang et al. | 365/185.18 |
| 2009/0280611 A1 | 11/2009 | Lue et al. | |
| 2010/0078758 A1 | 4/2010 | Sekar et al. | |

FOREIGN PATENT DOCUMENTS

| | | |
|---|---|---|
| WO | 93/11540 A1 | 6/1993 |
| WO | 2004/025660 A1 | 3/2004 |

OTHER PUBLICATIONS

International Search Report and Written opinion for related PCT Application No. PCT/US2011/001484, Mailed Mar. 28, 2012 (10 pages).

* cited by examiner

*Primary Examiner* — Son Mai

(74) *Attorney, Agent, or Firm* — Brooks, Cameron & Huebsch, PLLC

(57) ABSTRACT

Memory cell structures and methods are described herein. One or more memory cells include a transistor having a charge storage node, a dielectric material positioned between the charge storage node and a channel region of the transistor, the channel region positioned between a source region and a drain region, and a first electrode of a diode coupled to the charge storage node.

28 Claims, 6 Drawing Sheets

MEMORY CELL STRUCTURES AND METHODS

TECHNICAL FIELD

The present disclosure relates generally to semiconductor memory devices, methods, and systems, and more particularly, to memory cell structures and methods.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), flash memory, resistance variable memory, such as phase change random access memory (PCRAM) and resistive random access memory (RRAM), and magnetic random access memory (MRAM), such as spin torque transfer random access memory (STT RAM), among others.

Some memory cells, such as flash memory cells, can be 1-transistor (1T) memory cells. An example of a flash memory cell is shown in FIG. 1. The flash memory cell 103 has a stacked gate structure that includes a floating gate 116 capacitively coupled to a control gate 120. The floating gate 116 and control gate 120 are often formed of a polysilicon material and are separated by a dielectric material 118 (e.g., an interpoly dielectric), which can be about 150 to 300 angstroms thick.

The flash cell 103 includes an N+ drain region 112 and an N+ source region 110 inside a well region of a P-substrate 101. The cell 103 also includes a tunnel oxide layer 114 overlying a channel region of the substrate 101 (e.g., between the floating gate 116 and the channel region of the substrate 101). The tunnel oxide layer 114 is often silicon dioxide and can be about 70 to 120 angstroms thick.

In operation, the cell 103 can be programmed by grounding the source terminal, applying a 5 to 10 volt signal to the drain 112 (e.g., via a bit line not shown), and applying a high programming voltage of, for example, 18 to 20 volts to control gate 120. The high voltage applied to the control gate 120 creates a high electric filed across tunnel oxide 114 generating hot electrons in the channel with enough energy to cross the tunnel oxide 114. These hot electrons are then trapped in the floating gate 116, resulting in a higher threshold voltage for the transistor, which can correspond to the cell 103 being programmed into an OFF (e.g., non-conducting) state.

The cell 103 can be erased by grounding the control gate 120 and the drain region 112 and applying a high voltage (e.g., 18 to 20 volts) to the source region 110 or the P-well region of substrate 101. The large voltage difference causes the trapped electrons on the floating gate 116 to tunnel through the thin oxide layer 114 by a mechanism known as Fowler-Nordheim tunneling.

1-transisotor memory cells such as flash memory cell 103 have a number of drawbacks with regard to performance. For instance, the relatively high voltage (e.g., 18 to 20V) used to program and/or erase the cell via tunneling through the tunnel oxide 114 can reduce the ability to scale the memory cell 103. Also, the relatively thin tunnel oxide 114 can degrade over time (e.g., over multiple program/erase cycles), which can effect the reliability of the cell 103.

DETAILED DESCRIPTION

Figure 1:
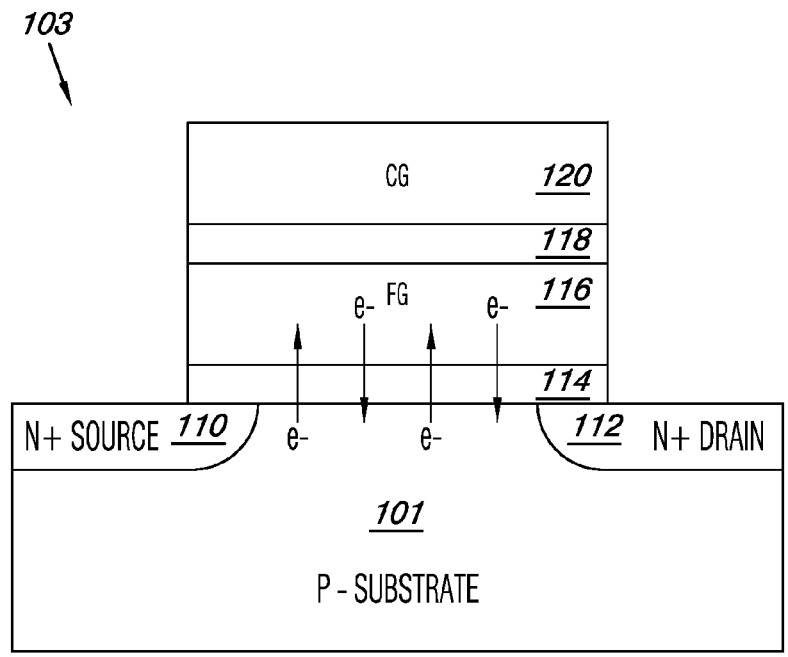
FIG. 1 illustrates a cross-sectional view of a memory cell in accordance with the prior art.

Memory cell structures and methods are described herein. One or more memory cells include a transistor having a charge storage node, a dielectric material positioned between the charge storage node and a channel region of the transistor, the channel region positioned between a source region and a drain region, and a first electrode of a diode coupled to the charge storage node.

One or more embodiments include biasing a diode with a first voltage to add charge to a charge storage node of a transistor through the diode, and biasing the diode with a second voltage to remove charge from the charge storage node through the diode. A first electrode of the diode is coupled to the charge storage node. Also, the first voltage and the second voltage are insufficient to provide the tunneling of charge through a dielectric material between the charge storage node and a channel region of the transistor.

Embodiments of the present disclosure provide various benefits such as reducing voltages associated with operating (e.g., programming, reading, and/or erasing) memory cells, as compared to previous approaches, among other benefits. The reduction in operating voltages can lead to memory cells having increased scalability and reliability as compared to previous memory cells due to factors such as a reduced tunnel oxide thickness and/or reduced degradation of the tunnel oxide material.

The figures herein follow a numbering convention in which the first digit or digits correspond to the drawing figure number and the remaining digits identify an element or component in the drawing. Similar elements or components between different figures may be identified by the use of similar digits. For example, 226 may reference element "26" in FIG. 2, and a similar element may be referenced as 426 in FIG. 4. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

Figure 2:
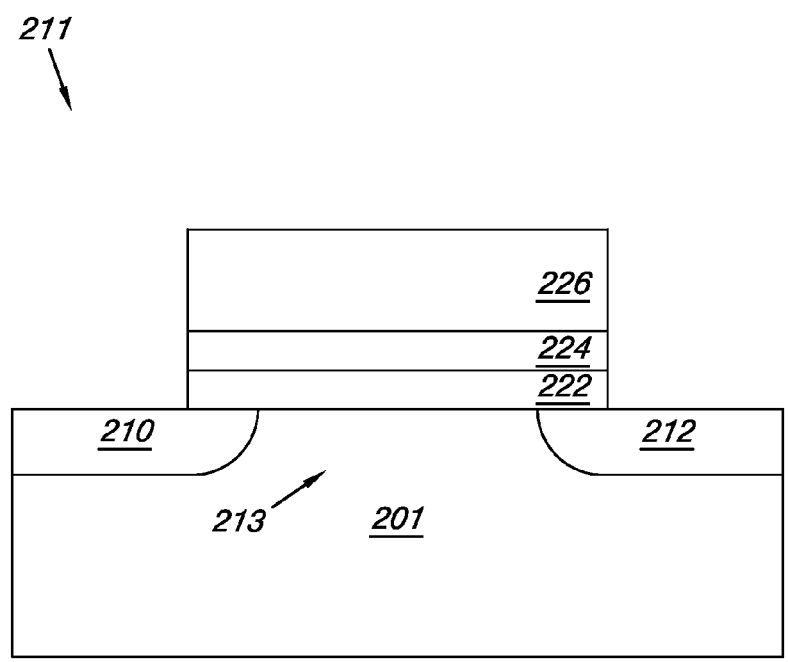
FIG. 2 illustrates a cross-sectional view of a memory cell in accordance with one or more embodiments of the present disclosure.

FIG. 2 illustrates a cross-sectional view of a memory cell 211 in accordance with one or more embodiments of the present disclosure. The memory cell 211 includes a transistor formed in a substrate 201. The substrate 201 can be a silicon substrate, silicon on insulator (SOI) substrate, or silicon on sapphire (SOS) substrate, among others. The transistor includes a source region 210 and a drain region 212, which are separated by a channel region 213. In this example, the transistor is formed in a p-type substrate 201 and includes an N+ source region 210 and an N+ drain region 212; however, embodiments are not so limited.

The transistor of memory cell 211 includes a dielectric material 222 formed on the substrate 201 and located between the channel region 213 and a charge storage node 224. In various embodiments, the dielectric material 222 can be a tunnel oxide material (e.g., $SiO_2$) and the storage node 224 can be a floating gate of the transistor. The charge storage node 224 can be a metal material, a polysilicon material, or a nanocrystal material, among other materials suitable for storing charge. As an example, in some embodiments, the charge storage node 224 can be a charge trap flash (CTF).

In one or more embodiments, the memory cell 211 includes a diode 226 having a first electrode (e.g., a bottom electrode) coupled to the charge storage node 224 of the transistor. As described further below, the diode 226 can be a metal-insulator diode, in various embodiments. Metal-insulator diodes can include one or more insulating materials between the two electrodes of the diode (e.g., between the anode and cathode). For instance, the diode 226 can be a metal-insulator-insulator-metal diode (MIIM diode) or a metal-insulator-insulator-insulator-metal diode (MIIIM). As used herein, the term "metal-insulator diode" includes diodes having one or more insulating materials between the electrodes of the diode. Embodiments are not limited to a particular type of diode 226. For instance, the diode 226 can be a PIN diode, a Zener diode, a Schottky diode, a resonance tunneling diode (RTD), or a thyristor, in some embodiments.

In operation, charge can be added to and/or removed from the charge storage node 224 in order to program or erase the cell 211, similar to operation of the memory cell 103. For instance, changing the amount of charge stored by the charge storage node 224 changes the threshold voltage (Vt) of the transistor, which can be indicative of a particular logic state of the memory cell. The state of the memory cell 211 can be determined (e.g., read) by sensing a current between the source 210 and drain 212 responsive to a particular voltage provided to the diode 226 (e.g., to a top electrode). For example, as described further below in connection with FIG. 4, a second electrode of the diode 226 can be coupled to an access line (e.g., a word line) corresponding to the memory cell 211, the drain 212 can be coupled to a data/sense line (e.g., a bit line), and the source 210 can be coupled to ground. A read voltage can be applied to the word line and the state of the cell 211 can be determined by sensing current/voltage of the bit line, which is dependent on the Vt of the transistor.

Unlike the 1-transistor flash memory cell 103 illustrated in FIG. 1, the 1-transistor memory cell 211 does not operate via Fowler-Nordheim tunneling and/or hot electron injection through the dielectric tunnel material 222. Instead, embodiments of the present disclosure can add charge to and/or remove charge from the charge storage node 224 via a conductive path through the diode 226 (e.g., via charge tunneling through the one or more insulator materials of the diode 226), rather than through the dielectric material 222.

Since the voltages associated with operating the diode 226 of memory cell 211 are lower than the voltages associated with operating memory cells such as cell 103 shown in FIG. 1, the memory cell 211 can provide reduced power consumption and reduced degradation of the dielectric tunnel material 222. The reduced degradation of dielectric material 222 can also allow the dielectric material 222 to be thinner than the tunnel material 114 associated with cell 103. For instance, the material 222 can have a thickness of about 40-60 angstroms, in some embodiments.

Figure 3A:
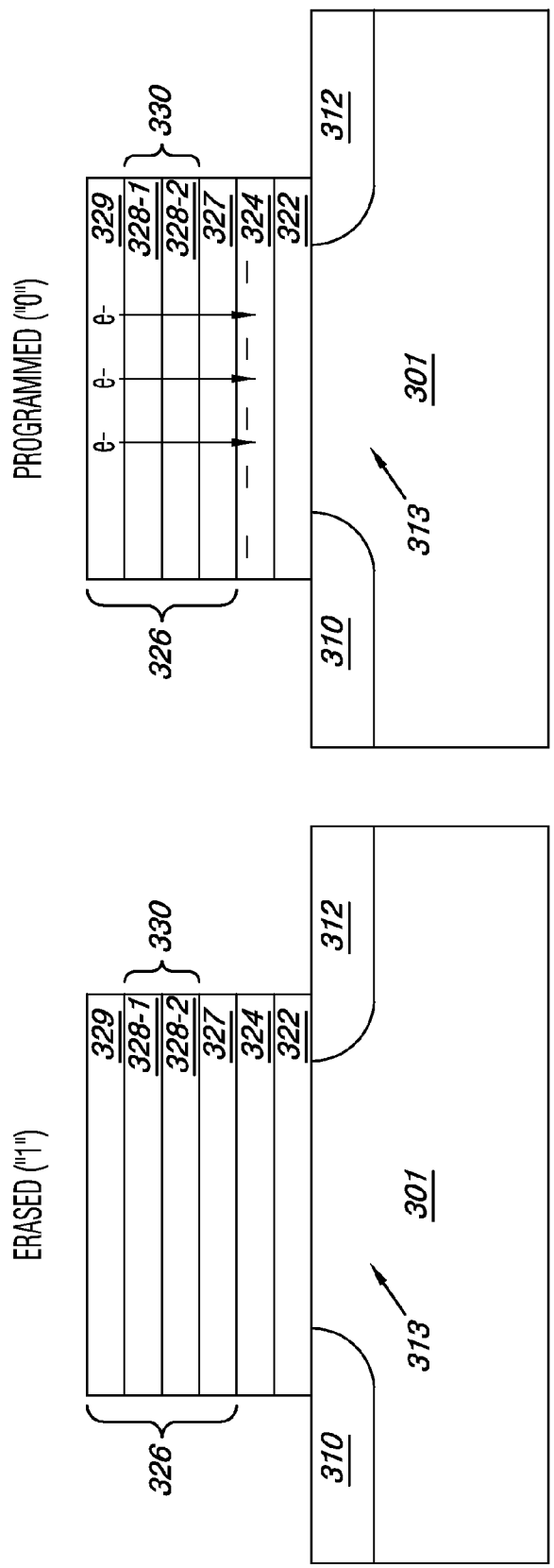
FIG. 3A illustrates a memory cell in an erased state and a programmed state in accordance with one or more embodiments of the present disclosure.

FIG. 3A illustrates a memory cell in an erased state and a programmed state in accordance with one or more embodiments of the present disclosure. Similar to the memory cell 211 shown in FIG. 2, the memory cell illustrated in FIG. 3A includes a transistor formed in a substrate 301. In this example, the transistor is formed in a p-type substrate 301 and includes an N+ source region 310 and an N+ drain region 312. The transistor includes a dielectric material 322 formed on the substrate 301 and located between the channel region 313 and a charge storage node 324. In this example, the charge storage node 324 is a floating gate of the transistor. The floating gate 324 can be a metal material, a polysilicon material, or a nanocrystal material, among other materials suitable for storing charge.

The memory cell illustrated in FIG. 3A includes a diode 326 having a first electrode 327 coupled to the floating gate 324. In this example, the diode 326 is a metal-insulator diode having an insulator stack 330 positioned between the first electrode 327 and a second electrode 329. The insulator stack 330 includes a first insulating material 328-1 and a second insulating material 328-2. As such, the diode 326 is a MIIM diode, in this example.

The left side of FIG. 3A illustrates the memory cell in an erased state and the right side of FIG. 3A illustrates the memory cell in a programmed state. To place the cell in the erased state, the diode 326 can be biased to remove charge (e.g., electrons) from the floating gate 324 through the insulator stack 330. To place the cell in the programmed state, the diode 326 can be biased to add charge to the floating gate 324 trough the insulator stack 330.

The particular configuration of the diode 326 corresponding to one or more memory cell embodiments of the present disclosure can depend on various factors such as the current level desired for programming and/or erasing the memory cell, for instance. The desired current level can depend on factors such as the desired programming time. For instance, to achieve a programming time on the order of nanoseconds (ns) to milliseconds (ms), a current density of about 5 $kA/cm^2$ to about 5 $mA/cm^2$ can be used. Embodiments are not limited to a particular programming time and/or current density requirement. The current density used to achieve a particular programming/erase time can depend various factors including the type of material, size, and/or thickness of floating gate 324, among other factors.

In one or more embodiments, the diode 326 can be an asymmetric MIIM diode such as a tantalum silicide/silicon oxide/zirconium oxide/titanium nitride (TaSi/SiOx/ZrOx/TiN) MIIM diode or a tantalum silicon nitride/silicon oxide/halfnium oxide/titanium nitride (TaSiN/SiOx/HfOx/TiN) MIIM diode. In one or more embodiments, the diode 326 can be a symmetric MIIIM diode such as a titanium nitride/silicon nitride/aluminum oxide/halfnium oxide/titanium nitride (TiN/$Si_3N_4$/AlOx/HfOx/TiN) MIIIM diode or a tantalum silicide/silicon nitride/aluminum oxide/zirconium oxide/tantalum silicide (TaSi/Si3N4/AlOx/ZrOx/TaSi) MIIIM diode. A symmetric diode refers to a diode having both electrodes of the same material(s) (e.g., such that the work functions of the top/bottom electrodes are the same), while an asymmetric diode includes electrodes made of different materials. Embodiments are not limited to these examples. For instance, various structures for diode 326 can produce corresponding current density versus voltage signals suitable for programming, reading, and/or erasing memory cells in accordance with embodiments described herein.

Figure 3B:
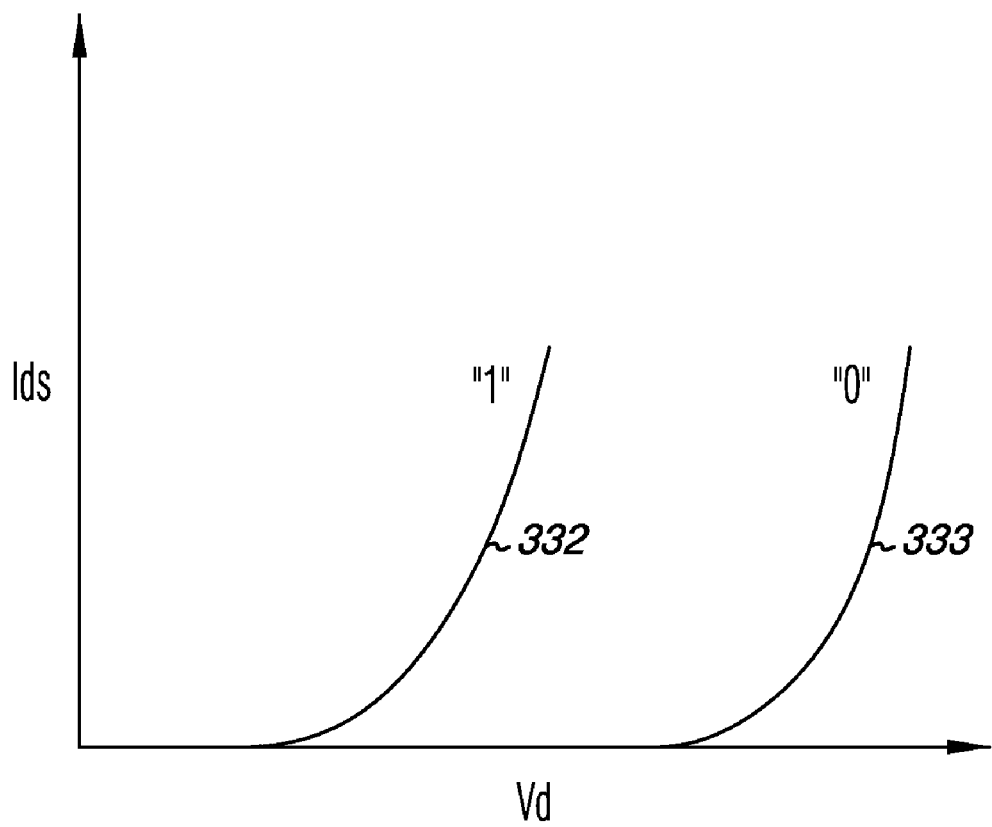
FIG. 3B is a diagram illustrating current versus voltage curves corresponding to the memory cell shown in FIG. 3A.

FIG. 3B is a diagram illustrating current versus voltage curves corresponding to the memory cell shown in FIG. 3A. The diagram illustrates the drain to source current (Ids) versus the voltage (Vd) across the diode 326. Curve 332 represents the current versus voltage curve for the cell in the erased state, while curve 333 represents the current versus voltage curve for the cell in the programmed state. As described above, the state of the memory cell can be determined by sensing the current Ids responsive to a particular voltage Vd applied to the diode 326. The difference between the curves 332 and 333 is due to the different threshold voltage (Vt) of the memory cell depending on whether the cell is programmed (e.g., electrons stored on the floating gate 324 through the insulator stack 330) or erased (e.g., electrons removed from floating gate 324 through the insulator stack 330).

Figure 4:
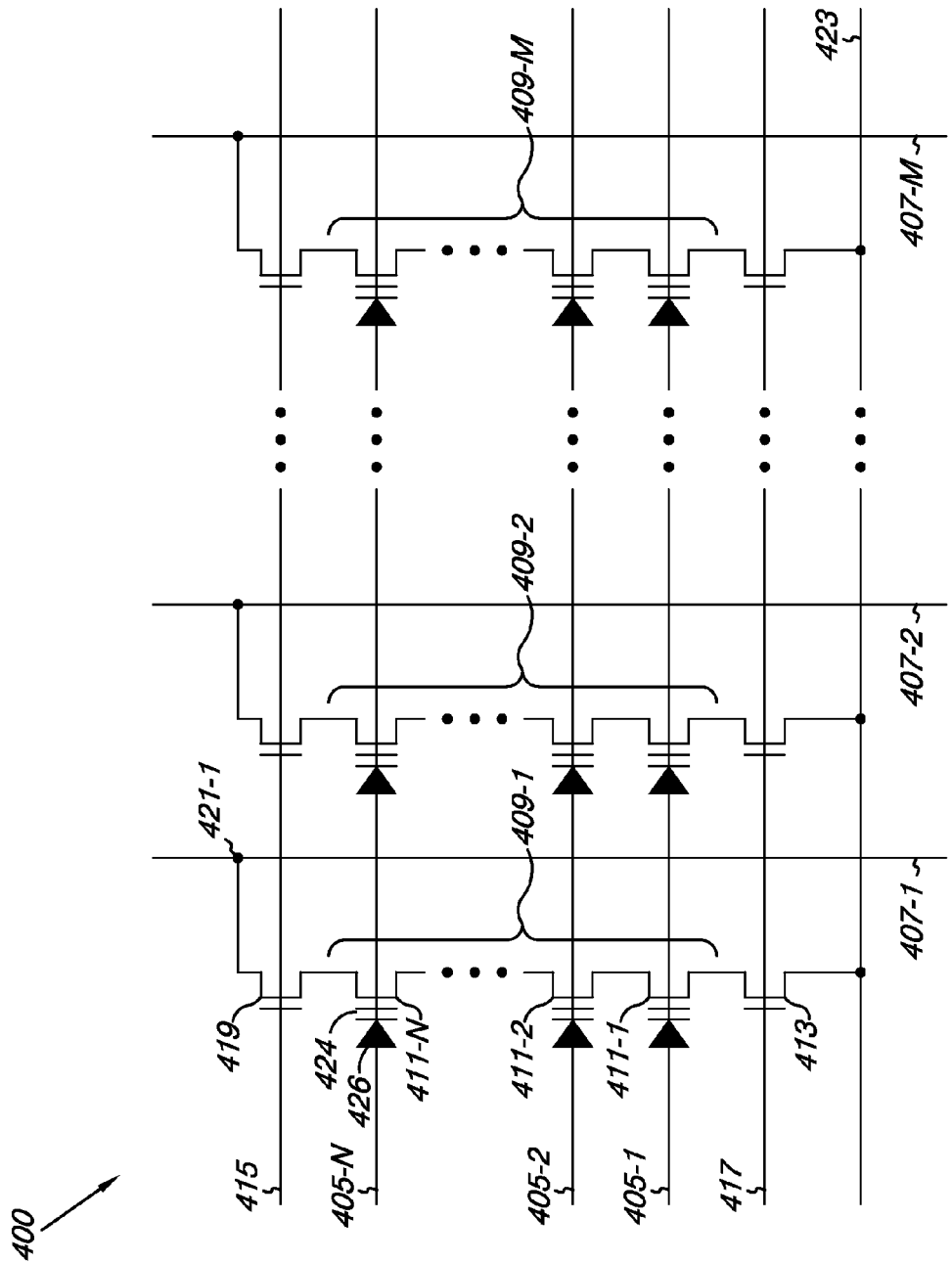
FIG. 4 illustrates a portion of a memory array having one or more memory cells in accordance with embodiments of the present disclosure.

FIG. 4 illustrates a portion of a memory array 400 having one or more memory cells in accordance with embodiments of the present disclosure. The embodiment of FIG. 4 illustrates an architecture similar to a NAND flash architecture. However, embodiments are not limited to this example. As shown in FIG. 4, the memory array 400 includes access lines (e.g., word lines 405-1, 405-2, . . . , 405-N) and corresponding sense lines (e.g., local bit lines 407-1, 407-2, . . . , 407-M). For ease of addressing in the digital environment, the number of word lines 405-1, 405-2, . . . , 405-N and the number of local bit lines 407-1, 407-2, . . . , 407-M can be some power of two (e.g., 256 word lines by 4,096 bit lines).

Memory array 400 includes NAND strings 409-1, 409-2, . . . , 409-M. Each NAND string includes memory cells 411-1, 411-2, . . . , 411-N, each associated with a respective word line 405-1, 405-2, . . . , 405-N. Each NAND string 409-1, 409-2, . . . , 409-M (and its constituent memory cells) is also associated with a local bit line 407-1, 407-2, . . . , 407-M. The memory cells 411-1, 411-2, . . . , 411-N of each NAND string 409-1, 409-2, . . . , 409-M are connected in series source to drain between a source select gate (SGS) (e.g., a field-effect transistor (FET) 413), and a drain select gate (SGD) (e.g., FET 419). Each source select gate 413 is configured to selectively couple a respective NAND string 409 to a common source 423 responsive to a signal on source select line 417, while each drain select gate 419 is configured to selectively couple a respective NAND string 409 to a respective bit line 407 responsive to a signal on drain select line 415.

As shown in the embodiment illustrated in FIG. 4, a source of source select gate 413 is connected to a common source line 423. The drain of source select gate 413 is connected to the source of the memory cell 411-1 of the corresponding NAND string 409-1. The drain of drain select gate 419 is connected to the local bit line 407-1 for the corresponding NAND string 409-1 at drain contact 421-1. The source of drain select gate 419 is connected to the drain of the last memory cell 411-N of the corresponding NAND string 409-1.

The memory cells 411-1, 411-2, . . . , 411-N can be memory cells such as memory cell 211 illustrated in FIG. 2. For instance, in one or more embodiments, construction of memory cells 411-1, 411-2, . . . , 411-N includes a transistor having a source, a drain, a floating gate or other charge storage node 424, and a diode 426. The diodes 426 of the memory cells 411-1, 411-2, . . . , 411-N have a first electrode coupled to the charge storage node 424 and a second electrode coupled to a respective word line 405-1, 405-2, . . . , 405-N.

As such, a "column" of the memory cells 411-1, 411-2, . . . , 411-N make up the NAND strings 409-1, 409-2, . . . , 409-M and are coupled to a given local bit line 407-1, 407-2, . . . , 407-M, respectively. A "row" of the memory cells 411-1, 411-2, . . . , 411-N are those memory cells commonly coupled to a given word line 405-1, 405-2, . . . , 405-N. The use of the terms "column" and "row" is not meant to imply a particular linear (e.g., vertical and/or horizontal) orientation of the memory cells). A NOR array architecture would be similarly laid out, except that the string of memory cells would be coupled in parallel between the select gates.

Operation of the memory array 400 can be similar to operation of an array of NAND flash memory cells such as cell 103 described in connection with FIG. 1. For instance, subsets of cells coupled to a target (e.g., selected) word line (e.g., 405-1, 405-2, . . . , 405-N) can be programmed and/or read together as a group. During a program operation, a selected word line associated with the memory cells targeted for the program operation would receive a first voltage (e.g., a program voltage) designed to change the data state of memory cells coupled to the selected word line if it is not program inhibited (e.g., via an inhibit voltage provided to the bit line to which the memory cell is coupled). The program voltage applied to the top electrode of the diode 426 (e.g., via the selected word line) is a voltage sufficient to activate (e.g., turn on) the diode 426 to create a conductive path through the diode to add charge to the floating gate 424. In various embodiments, the program voltage is insufficient to provide tunneling of electrons through the tunneling dielectric material (e.g., material 222 shown in FIG. 2 or material 322 shown in FIG. 3A) of the memory cell. As an example, the program voltage can have a magnitude of about 3-5 volts.

To perform an erase operation, the diodes 426 of the memory cells 411-1, 411-2, . . . , 411-N can be biased with an erase voltage opposite in polarity to the programming voltage. The erase voltage is sufficient to activate the diode to create a conductive path through the diode 426 to remove charge from the floating gate 422. Similar to the program voltage, the erase voltage is insufficient to provide tunneling of electrons through the tunneling dielectric material of the cell. As such, the erase voltage is sufficient to create electron tunneling through the insulator material(s) of the diode 426 (e.g., through the insulator stack 330 shown in FIG. 3A), but insufficient to provide Fowler-Nordheim tunneling and/or hot electron injection through the dielectric material located between the floating gate 422 and the channel region of the transistor. The erase voltage can be about 3 to 5 volts, for example. However, the magnitude of the program and/or erase voltage can vary depending on various factors such as the configuration of the diode 426 and the desired programming current and/or desired programming speed, among other factors.

During a sensing operation, such as a read operation, conduction of a bit line coupled to a selected cell (e.g., via a determined voltage and/or current change of the bit line) can be sensed in order to determine the state of the selected cell. The sensing operation can involve biasing the diode 426 (e.g., via a selected word line 405-1, 405-2, . . . , 405-N) at a voltage lower in magnitude than the program and/or erase voltage and then sensing voltage and/or current on a bit line (e.g., bit line 407-1) corresponding to the selected memory cell. A read operation could alternatively include precharging the bit line (e.g., 407-1) and sensing the discharge with the selected cell begins to conduct. As an example, the read voltage applied across the diode 426 can be about −1 to −2 volts; however, embodiments are not limited to a particular read voltage.

The memory cells 411-1, 411-2, . . . , 411-N can be non-volatile memory cells. However, in some embodiments, the memory cells 411-1, 411-2, . . . , 411-N can be volatile such that power is required to maintain the stored state of the cells.

Figure 5A:
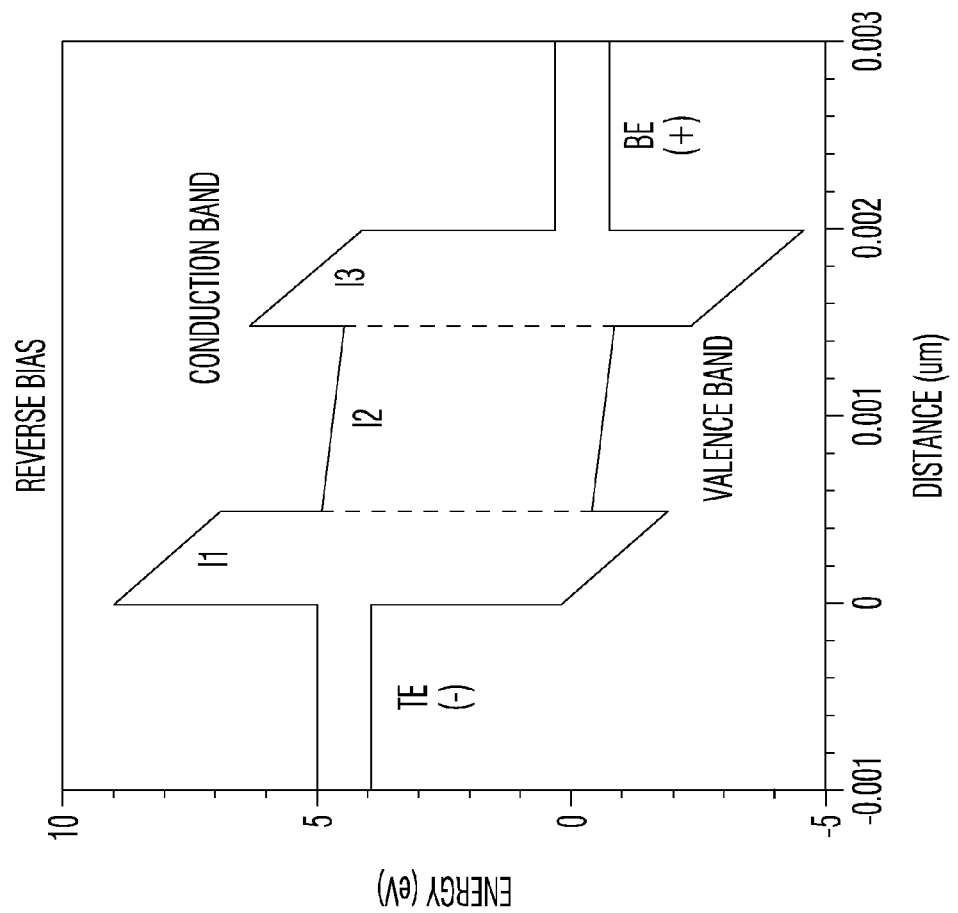
FIG. 5A is an energy band diagram corresponding to a diode in accordance with one or more embodiments of the present disclosure.

FIG. 5A is an energy band diagram 550 corresponding to a diode in accordance with one or more embodiments of the present disclosure. The diagram 550 can correspond to a diode such as diode 226 shown in FIG. 2. In the example illustrated in FIG. 5A, the diode is a MIIIM diode that has a stack of three insulator materials (I1, I2, and I3) between a top electrode (TE) and bottom electrode (BE). As an example, the top and/or bottom electrodes can be a material such as TaSi, TiN, TaSiN, or a doped polysilicon material. The insulator stack can include various different insulator materials including, but not limited to, various oxide and/or nitride materials such as SiOx, ZrOx, HfOx, AlOx, $Si_3N_4$, TaOx, LaOx, and SiON. In one or more embodiments, the insulators I1, I2, and I3 of the insulator stack can have an oxide-nitride-oxide (ONO) configuration. At least one of the insulator materials I1, I2, and I3 can be a high-K dielectric material, in one or more embodiments.

Embodiments are not limited to particular diode configuration. For instance, some embodiments can include a diode having more or fewer than three insulator materials in the insulator stack.

In this example, the first (I1) and third (I3) insulators have a thickness of about 5 angstroms and the second insulator (I2) has a thickness of about 10 angstroms. However, the dimensions of the insulators I1, I2, and I3 can vary depending on factors such as the types of insulator materials and the desired current density versus voltage curve, among other factors.

The energy band diagram 550 illustrates the MIIIM diode under reverse bias (e.g., the potential of the top electrode is lower than the potential of the bottom electrode). Under such a reverse bias, electrons can tunnel through the insulator materials of the diode (e.g., from the top electrode to the bottom electrode) and can be stored in a charge storage node (e.g., charge storage node 224 shown in FIG. 2 or floating gate 424 shown in FIG. 4), which is coupled to the bottom electrode, as discussed above. Although not shown in diagram 550, a forward bias applied across the diode can be used to induce tunneling of electrons from the charge storage node of the memory cell through the insulator stack in order to remove charge from the storage node (e.g., to erase the memory cell).

Figure 5B:
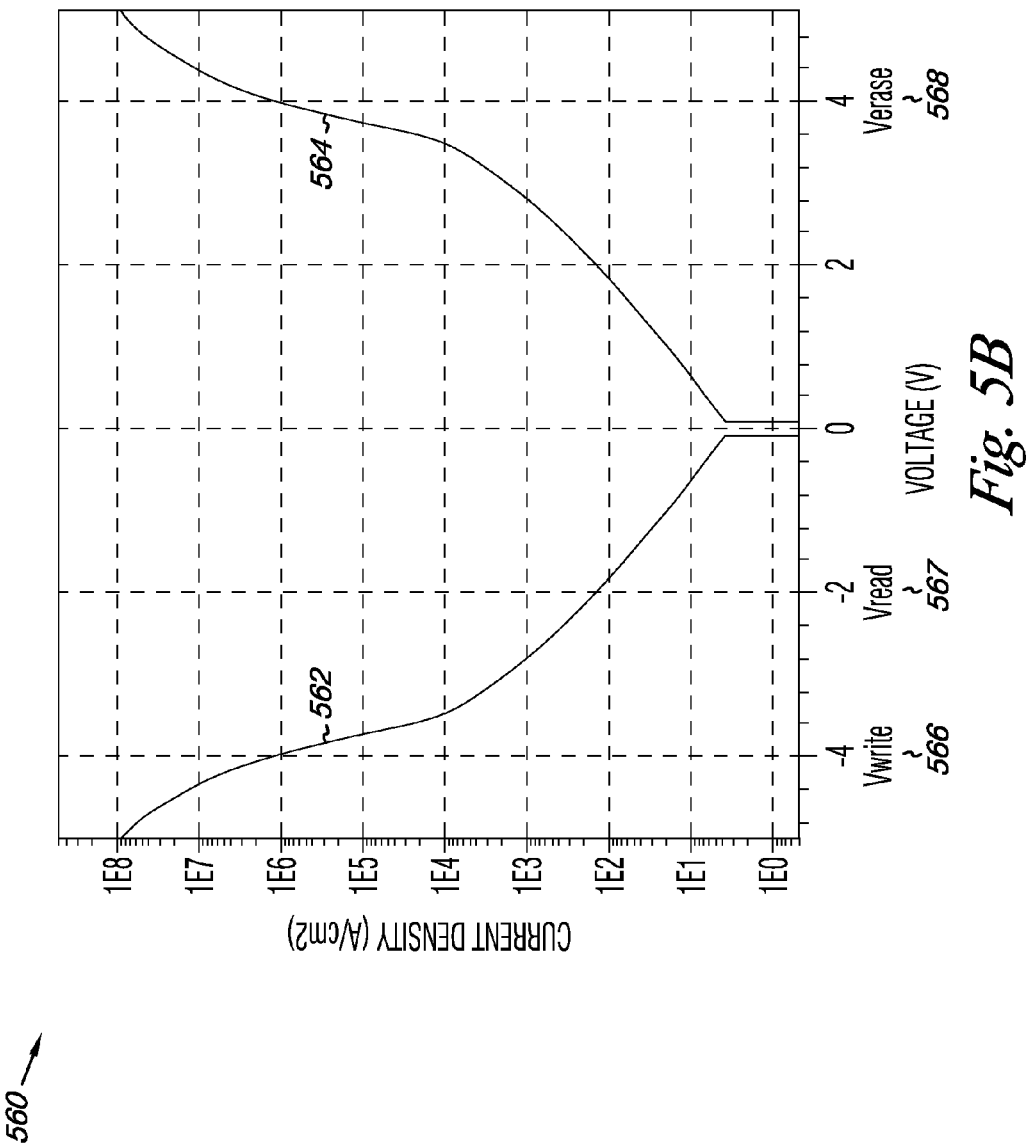
FIG. 5B is a diagram illustrating current density versus voltage associated with the diode of FIG. 5A.

FIG. 5B is a diagram 560 illustrating current density versus voltage associated with the diode of FIG. 5A. Curve 562 represents the metal-insulator diode under reverse bias and curve 564 represents the metal-insulator diode under forward bias. In this example, the diode is a symmetric diode such that the forward and reverse bias curves are symmetric; however, embodiments are not limited to this example. For instance, embodiments of the present disclosure can include diodes having various asymmetric configurations such that the forward and reverse bias curves would by asymmetric.

Diagram 560 represents one example of a current density versus voltage response of a diode that can be used in accordance with one or more memory cells described herein (e.g., memory cell 211 shown in FIG. 2). In operation, the diode can be biased at a first voltage (e.g., Vwrite 566) in order to program a memory cell. The write voltage 566 is sufficient to provide a suitable current through the insulator stack of the diode in order to rapidly accumulate charge on the charge storage node of the memory cell. In this example, Vwrite 566 is about −4 volts, which provides a current density of about $1 \times 10^6$ A/cm². In various embodiments, the current density associated with programming voltage 566 is at least $1 \times 10^4$ A/cm². However, the current density can vary based on the configuration of the diode and/or the desired programming time for the cell, among other factors.

The diode can be biased at a second voltage (e.g., Verase 568) in order to erase the memory cell. That is, the erase voltage 568 is sufficient to provide a suitable current through the insulator stack of the diode in order to rapidly remove charge from the charge storage node of the memory cell. In this example, Verase 568 is about 4 volts, which provides a current density of about $1 \times 10^6$ A/cm².

In various embodiments, the write voltage (e.g., Vwrite 566) and the erase voltage (e.g, Verase 568) are insufficient to provide the tunneling of charge through a dielectric material (e.g., a tunnel oxide material) between the charge storage node and a channel region of the transistor. For instance, the erase voltage and the write voltage can have a magnitude of less than about 5 volts, in some embodiments. Biasing the diode with the write voltage 566 and/or the erase voltage 568 can include creating a particular voltage difference between the top electrode of the diode and a well region of the substrate. Biasing the diode of the memory cell at a voltage insufficient to promote Fowler-Nordheim tunneling and/or hot electron injection through the tunnel oxide material can prevent degradation of the tunnel oxide material, among other benefits.

In order to read the state of the memory cell, the diode can be biased with a third voltage (e.g., Vread 567). The read voltage 567 is lower in magnitude than the write voltage 566 and the erase voltage 568 since it is desirable to have a lower current flow through the diode during a read operation. In this example, the Vread 567 is about −2 volts, which provides a current density of about $1 \times 10^2$ A/cm². In various embodiments, the current density associated with read voltage 567 is not more than $1 \times 10^2$ A/cm². A logic state (e.g., a logic "0" or "1") can be determined, for example, by sensing a current between a source and a drain of the transistor responsive to the read voltage applied to the top electrode of the metal-insulator diode.

Memory cell structures and methods are described herein. One or more memory cells include a transistor having a charge storage node, a dielectric material positioned between the charge storage node and a channel region of the transistor, the channel region positioned between a source region and a drain region, and a first electrode of a diode coupled to the charge storage node.

One or more embodiments include biasing a diode with a first voltage to add charge to a charge storage node of a transistor through the diode, and biasing the diode with a second voltage to remove charge from the charge storage node through the diode. A first electrode of the diode is coupled to the charge storage node. Also, the first voltage and the second voltage are insufficient to provide the tunneling of charge through a dielectric material between the charge storage node and a channel region of the transistor.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory cell, comprising:
a transistor including a charge storage node;
a dielectric material positioned between the charge storage node and a channel region of the transistor, the channel region positioned between a source region and a drain region; and
a first electrode of a diode coupled to the charge storage node;
wherein the diode is configured such that it provides a first current density of at least $1 \times 10^4$ A/cm$^2$ responsive to a first applied voltage having a magnitude of about 4V.

2. The memory cell of claim 1, wherein the diode is a metal-insulator diode having at least a first and a second insulator material positioned between the first electrode and a second electrode.

3. The memory cell of claim 1, wherein the diode includes a stack of at least three insulator materials positioned between the first electrode and a second electrode.

4. The memory cell of claim 1, wherein the charge storage node is a floating gate of the transistor.

5. The memory cell of claim 1, wherein a second electrode of the diode is coupled to a word line corresponding to the memory cell.

6. The memory cell of claim 1, wherein at least one of the source region and the drain region is coupled to a bit line corresponding to the memory cell.

7. The memory cell of claim 1, wherein the storage node includes a material selected from the group including:
a metal material;
a polysilicon material; and
a nanocrystal material.

8. The memory cell of claim 1, including a conductive path through the diode that provides charge to the storage node.

9. The memory cell of claim 1, including a conductive path through the diode that removes charge from the storage node.

10. A memory cell, comprising:
a transistor having a floating gate separated from a channel region by a dielectric material; and
a first electrode of a diode coupled to the floating gate;
wherein the diode is configured such that it provides a first current density of at least $1 \times 10^4$ A/cm$^2$ responsive to a first applied voltage having a magnitude of about 4V.

11. The memory cell of claim 10, wherein the diode is a diode selected from the group including:
a metal-insulator diode;
a PIN diode;
a Zener diode;
a Schottky diode; and
a resonance tunneling diode (RTD).

12. The memory cell of claim 10, wherein the diode is a metal-insulator diode including a first and a second insulator material of an insulator stack positioned between the first electrode and a second electrode of the metal-insulator diode.

13. The memory cell of claim 12, including a conductive path through the insulator stack by which charge is provided to, and removed from, the floating gate.

14. The memory cell of claim 12, wherein the insulator stack includes at least a third insulator material positioned between the first and the second electrode.

15. The memory cell of claim 10, wherein the diode is configured such that it provides a second current density of not more than $1 \times 10^2$ A/cm$^2$ responsive to a second applied voltage having a magnitude of about 2V.

16. The memory cell of claim 12, wherein the insulator stack is an ONO (oxide-nitride-oxide) stack.

17. The memory cell of claim 10, wherein a thickness of the dielectric material separating the channel region from the floating gate is less than about 60 angstroms.

18. A method of operating a memory cell, the method comprising:
biasing a diode with a first voltage to add charge to a charge storage node of a transistor through the diode; and
biasing the diode with a second voltage to remove charge from the charge storage node through the diode;
wherein a first electrode of the diode is coupled to the charge storage node; and
wherein the first voltage and the second voltage are insufficient to provide tunneling of charge through a dielectric material between the charge storage node and a channel region of the transistor; and
wherein the diode is configured such that it provides a current density of at least $1 \times 10^4$ A/cm$^2$ responsive to an applied voltage having a magnitude of about 4V.

19. The method of claim 18, wherein biasing the diode with the first voltage includes programming the memory cell.

20. The method of claim 19, wherein biasing the diode with the second voltage includes erasing the memory cell.

21. The method of claim 18, wherein the first voltage and the second voltage have a magnitude of less than about 5V.

22. The method of claim 18, including determining a state of the memory cell by sensing a current between a source and a drain of the transistor responsive to biasing the diode with a third voltage lower in magnitude than the first and the second voltage.

23. The method of claim 18, wherein the diode is a metal-insulator diode including a stack of at least two insulator materials between the first electrode and a second electrode of the diode.

24. A method of operating a memory cell, the method comprising:
placing the memory cell in a first state by providing charge to a floating gate of a transistor through an insulator stack of a metal-insulator diode having a first electrode coupled to the floating gate; and
determining a logic state of the memory cell by sensing a current between a source and a drain of the transistor responsive to a read voltage applied to a second electrode of the metal-insulator diode; and
wherein the diode is configured such that it provides a current density of at least $1 \times 10^4$ A/cm$^2$ responsive to an applied voltage having a magnitude of about 4V.

25. The method of claim 24, including placing the memory cell in a second state by removing charge from the floating gate of the transistor through the insulator stack of the metal-insulator diode.

26. The method of claim 25, wherein the first state is a programmed state and the second state is an erased state.

27. The method of claim 24, wherein placing the memory cell in the first state includes providing a first voltage difference between the second electrode and a well region associated with the transistor, the first voltage difference insufficient to provide charge tunneling through a dielectric material located between the floating gate and a channel region of the transistor.

28. The method of claim 24, wherein the insulator stack includes a first, a second, and a third insulator material, and wherein at least one of the first, the second, and the third insulator material is a high-K dielectric.

* * * * *